United States Patent [19]
Webster

[11] Patent Number: 5,359,299
[45] Date of Patent: Oct. 25, 1994

[54] HIGH SPEED AND LOW DRIFT CHARGE PUMP CIRCUIT

[75] Inventor: Stephen Webster, Oakville, Canada

[73] Assignee: Gennum Corporation, Burlington, Canada

[21] Appl. No.: 6,396

[22] Filed: Jan. 21, 1993

[51] Int. Cl.⁵ ............... H03L 7/089; H03L 7/093; H03K 17/56; H03K 17/28
[52] U.S. Cl. ............................. 331/8; 331/17; 331/25; 307/246; 307/597; 307/603
[58] Field of Search ............... 331/17, 8, 25; 307/597, 307/603, 246, 639, 640, 641, 642

[56] References Cited
U.S. PATENT DOCUMENTS
5,126,692  6/1992  Shearer et al. ................ 331/17 X
5,153,530 10/1992  Takagi et al. ................... 331/17

Primary Examiner—David Mis
Attorney, Agent, or Firm—Bereskin & Parr

[57] ABSTRACT

A device for converting binary logic pulses into an output current and the output current being switchable between a positive and negative polarity. The device provides a charge pump circuit which is suitable for the phase-detector stage in a phase-locked loop (PLL) circuit. The charge pump circuit comprises an input stage for the "UP" binary logic pulses and a second stage for the "DOWN" binary logic pulses. The input stages comprise emitted-coupled transistor pairs. The circuit includes current sources and current sinks for generating the output current in the input stages in response to the binary logic pulses. The circuit features a pair of switch diodes coupled between the outputs of the input stages. The diodes form a commutator which controls the direction of the output current and the leakage current during the idle states. The circuit also includes a clamping circuit to limit the voltage swing across the switching diodes. The charge pump circuit according to the present invention exhibits a fast response time, a symmetrical response to the binary logic pulses, and virtually zero leakage current in the idle state. The charge pump circuit utilizes non-complimentary bipolar processes and is suitable for a monolithic integrated circuit implementation.

12 Claims, 6 Drawing Sheets

PHASE LOCKED LOOP (PLL) PRIOR ART

HIGH SPEED AND LOW DRIFT CHARGE PUMP CIRCUIT

FIELD OF THE INVENTION

This invention relates to a charge pump circuit commonly used in phase-locked loop circuits. More particularly, the present invention relates to a charge pump topology utilizing non-complementary bipolar processes that is suitable for a monolithic integrated circuit implementation.

BACKGROUND OF THE INVENTION

A charge pump is an electronic circuit block which is commonly used in phase-locked loop circuits. A phase-locked loop (PLL) is a frequency-selective device comprising a phase detector, a loop filter, an amplifier, and a voltage controlled oscillator (VCO) interconnected in known manner to form a feedback system. The charge pump converts the logic level pulses generated by the phase detector into current pulses which are fed to the loop filter. The loop filter integrates the current pulses to produce a control voltage for the voltage controlled oscillator.

The logic level pulses used by the charge pump are commonly referred to as "PUMP UP" or "UP" pulses and "PUMP DOWN" or "DOWN" pulses. In response to these pulses, the charge pump produces an output current $I_O$. In known manner, the output current $I_O$ is generated according to a logic truth table comprising the "PUMP UP" and "PUMP DOWN" logic pulses.

In addition to the static relationship between the logic pulses and the output current $I_O$, there is a requirement that the total charge supplied to the loop filter by the charge pump be an accurate reflection of the pulse widths of the UP and DOWN logic signals. For an UP pulse having a width of time $T_{UP}$, the charge produced by the charge pump should be $I*T_{UP}$ coulombs. For a DOWN pulse having a width of time $T_{DOWN}$, the charge pump should produce a charge of $-I*T_{DOWN}$ coulombs. However, in practical charge pump implementations, the pulses of output current $I_O$ cannot be perfectly square due to the limitations of non-zero rise and fall times. Thus, the actual charge supplied by the charge pump to the loop filter will be less than the ideal quantity discussed above. It therefore becomes important that the non-ideality for the DOWN and UP charge pulses be the same for both the UP and DOWN signals so that UP and DOWN logic input pulses having equal width result in a net charge or current of zero. This condition should also hold true if the UP and DOWN pulses overlap or are coincident in time.

Another problem experienced in practical implementations of charge pumps concerns the output leakage current, i.e. a non-zero output current when a zero output current is desired. According to the logic level truth table for a charge pump, there are two conditions calling for zero output current, i.e. UP=DOWN=logic level 0 and UP=DOWN=logic level 1. Of the two conditions, the first condition UP=DOWN=logic level 0 is the most critical since this is the idle condition. Any leakage current in the idle condition will cause the control voltage output from the loop filter to vary and hence the voltage controlled oscillator frequency to drift. It will be appreciated by those skilled in the art that in some systems utilizing a phase-locked loop, a relatively long time may be spent in the idle state and therefore even modest levels of leakage current can cause the phase-locked loop to jitter or even lose frequency lock.

In summary, the practical charge pump should exhibit fast response time, symmetrical response to the input logic level pulses, and virtually zero idle state output leakage current.

BRIEF SUMMARY OF THE INVENTION

In a first aspect, the present invention provides a device for producing an output current switchable between a source current and a sink current in response to binary logic pulses said device comprising: (a) a first input stage for inputting a first binary logic pulse, said first input stage having an output and means for generating a first current component at said output in response to said first binary logic pulse; (b) a second input stage for inputting a second binary logic pulse, said second input stage having an output and means for generating a second current component at the output of said second input stage in response to said second binary logic pulse; (c) current drive means for producing a third current component, said current drive means having an output for said third current component coupled to the output of said first input stage and including means responsive to a control signal for controlling said third current component and (d) commutating means responsive to said first, second and third current components for producing the output current, said commutating means including first and second switches and an output port for the output current said first switch having an input coupled to the output of said first input stage and an output and means for sourcing a constant output current at said output in response to said first and third current components and said second switch having an output coupled to the output of said second input stage having an input coupled to the output of said first switch and including means for sinking a constant output current at said input in response to said second current component, said output port being formed from the output of said first switch and the input of said second switch. The present invention accordingly provides a charge pump circuit which features a fast response time, a symmetrical response to binary logic pulses, and a very low leakage current in the idle stage.

BRIEF DESCRIPTION OF THE DRAWINGS

For a better understanding of the present invention, and to show more clearly how it may be carried into effect, reference will now be made, by way of example, to the accompanying drawings which show a preferred embodiment of the present invention.

DETAILED DESCRIPTION OF THE PREFERRED EMBODIMENT

Figure 1:
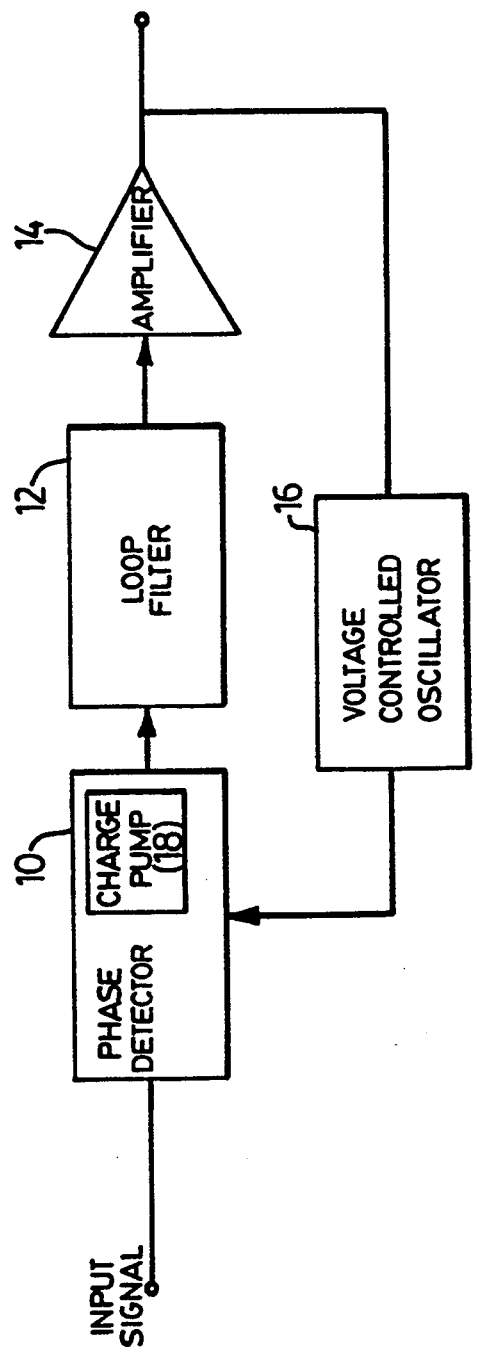
FIG. 1 shows a phase-locked loop which utilizes a charge pump according to the present invention.

FIG. 1 shows a standard phase-locked loop circuit. The phase-locked loop (PLL) is one of the fundamental circuit blocks of communications systems. The PLL is a frequency-selective circuit comprising a phase detector 10, a loop filter 12, an amplifier 14, and a voltage controlled oscillator 16. As shown in FIG. 1, the phase detector 10, the loop filter 12, and the amplifier 14 are connected to a form feedback system with the voltage controlled oscillator 16. A charge pump 18 according to the present invention is incorporated into the phase detector 10 to convert logic level pulses generated by the phase detector 10 into an output current $I_O$ (current pulses) which are then fed to the loop filter 12.

Figure 2:
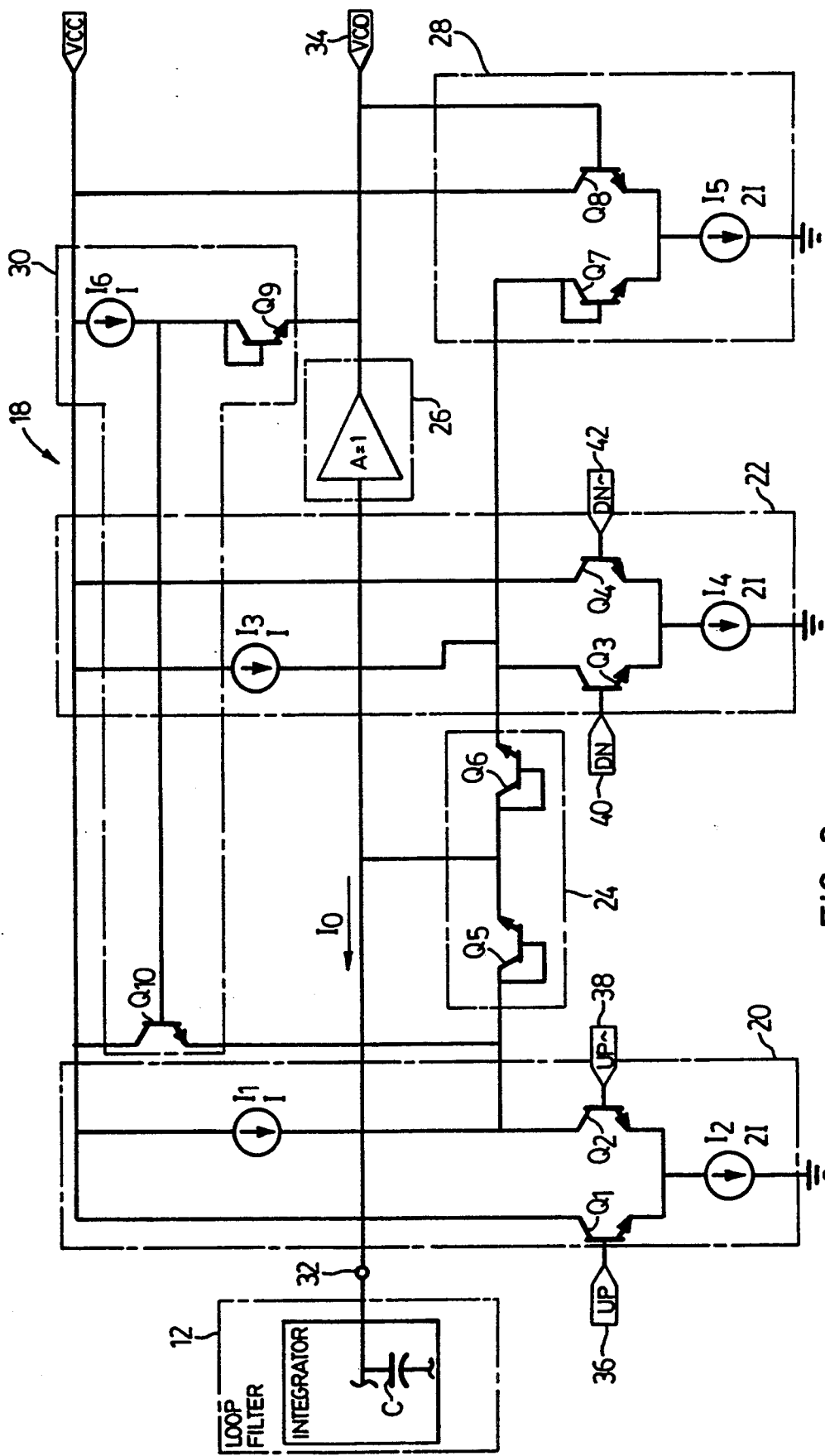
FIG. 2 shows in schematic form a charge pump according to the present invention.

Reference will now be made to FIG. 2 which shows in detail a charge pump topology 18 according to the present invention. The charge pump topology 18 utilizes only NPN devices for current switching, and therefore is well suited for a monolithic integrated circuit implementation. As shown in FIG. 2, the charge pump topology 18 according to the present invention comprises an UP logic pulse input stage 20, a DOWN logic pulse input stage 22, a commutating stage 24, a buffer stage 26, a clamping circuit 28, a current drive stage 30, a loop filter output terminal 32 and a voltage controlled oscillator input terminal 34. The output terminal 32 allows the charge pump 18 (and output current $I_O$) to be coupled to the loop filter 12. The loop filter 12 typically includes an integrating capacitor C which converts the output current $I_O$ from the charge pump 18 into a voltage signal for controlling the voltage controlled oscillator stage 16.

Considering first the UP logic pulse input stage 20 shown in FIG. 2, the UP pulse input stage 20 comprises a pair of NPN transistors $Q_1$ and $Q_2$, which are emitter coupled to form a differential pair current switch. As is known in the art, the emitter-coupled transistor topology offers high speed operation because the transistors do not operate in the saturation region. The base of the first transistor $Q_1$ provides a non-inverted UP logic pulse input terminal 36, and the base of the second transistor $Q_2$ is an input terminal 38 for the inverted UP (UP*) logic pulse input. In known manner, the input stage 20 includes a current source $I_1$ and a current sink $I_2$. Current source $I_1$ connects to the collector of transistor $Q_2$ and produces an internal current I. Current sink $I_2$ connects to the coupled emitters of transistors $Q_1$ and $Q_2$ and sinks a current (2I) which flows in the emitters of the two transistors $Q_1$ and $Q_2$ when they are switched on. The collector of transistor $Q_2$ provides an output for the UP pulse input stage 20.

Referring still to FIG. 2, the DOWN pulse input stage 22 is very similar to the UP pulse input stage 20 described above. The DOWN pulse input stage 22 comprises two transistors $Q_3$ and $Q_4$ which are also emitter-coupled to form a differential pair current switch. The base of transistor $Q_3$ provides an input 40 for the non-inverted DOWN pulse, and the base of transistor $Q_4$ provides an input 42 for the inverted DOWN pulse. The DOWN input stage 22 also includes a current source $I_3$ and a current sink $I_4$. In known manner, the current source $I_3$ connects to the collector of transistor $Q_3$ and produces an internal current I which flows into the collector of transistor $Q_3$. The current sink $I_4$ connects to the coupled emitters of transistors $Q_3$ and $Q_4$ and sinks a current 2I which flows from the emitters of the transistors $Q_3$ and $Q_4$. The collector of transistor $Q_3$ provides an output from the DOWN pulse input stage 22.

The commutating stage 24 comprises two diodes which can be formed from two diode-connected transistors $Q_5$ and $Q_6$. The function of the diodes (diode-connected transistors) $Q_5$ and $Q_6$ in the commutating stage 24 is to correct leakage or drift current when the charge pump is in one of the idle states (i.e. UP=DOWN=logic 0 or UP=DOWN=logic 1). The two diode-connected transistors $Q_5$ and $Q_6$ are coupled between the collector of transistor $Q_2$ and the collector of transistor $Q_3$. The anode of diode $Q_5$ is connected to the collector of transistor $Q_2$ and the cathode of diode $Q_5$ is connected to the anode of diode $Q_6$. The cathode of diode $Q_5$ is connected to the collector of transistor $Q_3$. The loop filter output terminal 32 connects to the node formed by the connection of the cathode of diode $Q_5$ and the anode of diode $Q_6$.

Referring still to FIG. 2, the current drive stage 30 comprises a drive transistor $Q_{10}$, a current source $I_6$ and a diode-connected transistor $Q_9$ (diode $Q_9$). The emitter of the drive transistor $Q_{10}$ is connected to the collector of transistor $Q_2$ and the anode of diode $Q_5$, and the collector of transistor $Q_{10}$ is connected to the positive supply rail $V_{CC}$. The base of transistor $Q_{10}$ is connected to the anode of diode $Q_9$ and the output of the current source $I_6$. The current source $I_6$ produces a current I which as will be explained is used to generate the output current $I_O$. The cathode of diode $Q_9$ is connected to the voltage controlled oscillator terminal 34 and the output of the buffer stage 26.

As shown in FIG. 2, the buffer stage 26 is connected between the loop filter output 32 and the VCO terminal 34. In the preferred embodiment, the buffer stage 26 comprises a unity gain amplifier 44 having a very high input impedance. The function of the buffer stage 26 is to buffer the voltage level on the filter output 32 for use by the drive stage 30 and the clamping circuit 28 to limit the voltage swing across the diodes $Q_5$ and $Q_6$ in the commutating stage 24.

The clamping circuit 28 is coupled between the collector of transistor $Q_3$ (i.e. the output of the DOWN pulse input stage) and output of the buffer stage 26 as shown in FIG. 2. The function of the clamping circuit 28 is to limit the voltage swing across the diodes $Q_5$ and $Q_6$ to a voltage of one $V_{BE}$ where $V_{BE}$ is the forward voltage drop across a base-emitter junction. The clamping circuit 28 comprises a diode-connected transistor $Q_7$, a transistor $Q_8$ and a current sink $I_5$. The anode of diode $Q_7$ is connected to the cathode of diode $Q_6$ and the cathode of diode $Q_7$ is connected to the emitter of transistor $Q_8$. The collector of transistor $Q_8$ is connected to the positive supply rail $V_{CC}$, and the base is connected to the VCO terminal 34 (and cathode of diode $Q_9$). The current sink $I_5$ is connected to the emitters of transistors $Q_7$ and $Q_8$ and is designed to sink a current of magnitude 2I.

Typical charge pumps provide an output current $I_O$ predetermined polarity in response to the UP and DOWN logic pulses according to the following truth table:

| UP | DOWN | $I_O$ |
|---|---|---|
| 0 | 0 | 0 |
| 0 | 1 | $-I_O$ |
| 1 | 0 | $+I_O$ |

| UP | DOWN | $I_O$ |
|---|---|---|
| 1 | 1 | 0 |

As shown in truth table, the charge pump produces the output current $I_O$ (which feeds the loop filter) in two states. The first state occurs when the UP pulse is logic level 0 and the DOWN pulse is logic level 1. This state is know as the PUMP DOWN state and results in the charge pump producing a negative output current $-I_O$. The other state is the PUMP UP state and occurs when the UP pulse is a logic level 1 and the DOWN pulse is at logic level 0. In the PUMP UP state, the charge pump produces a positive output current $I_O$. The remaining two states are idle states and in theory the output current $I_O$ should be zero. However in practical implementations, there will be a leakage current which flows in the output terminal 32. The remainder of the description will explain the operation of the charge pump 18 according to the present invention in each of the four states shown in truth table.

Figure 3:
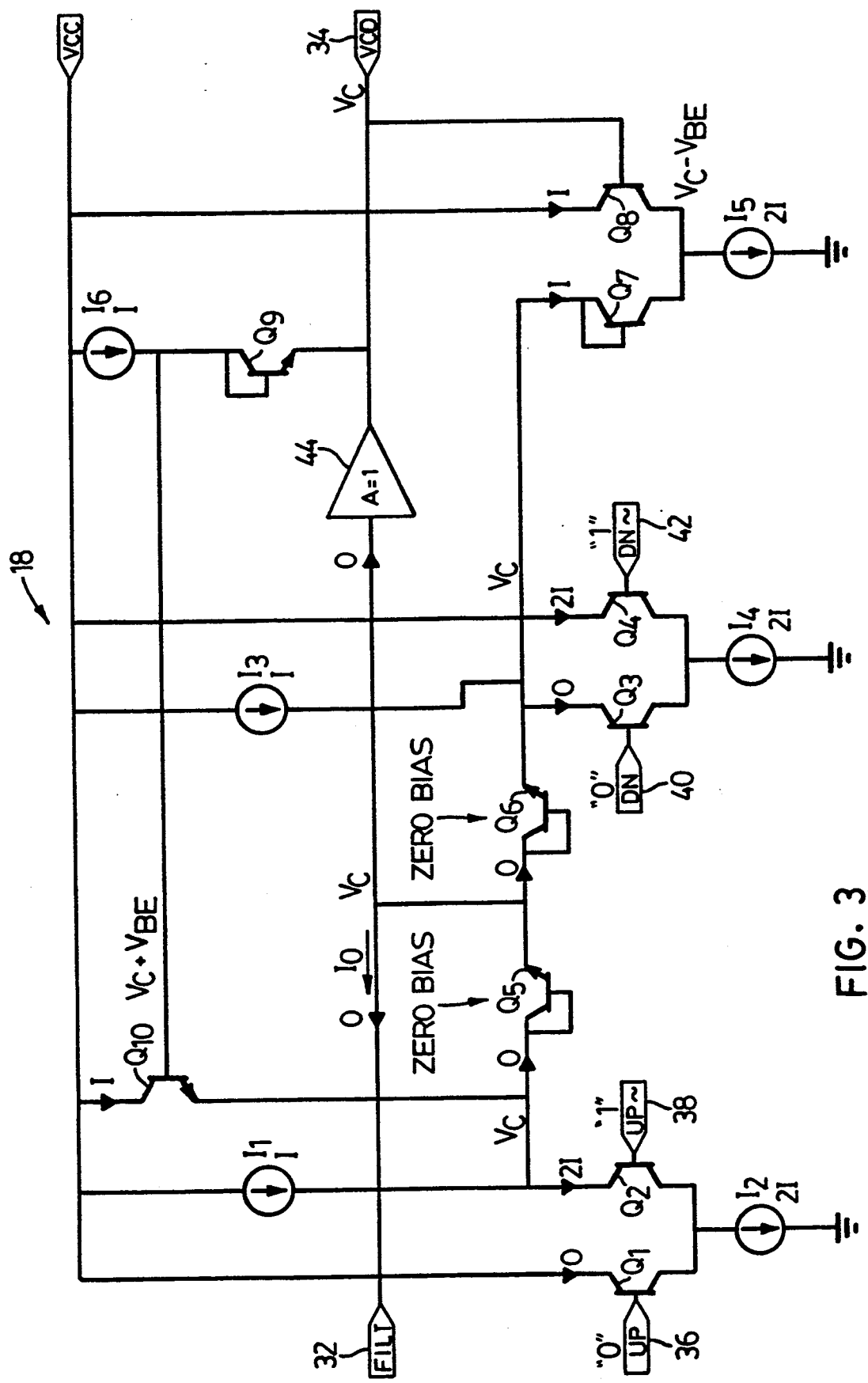
FIG. 3 shows the charge pump according to the present invention operating in the idle state.

Reference is first made to FIG. 3 which shows the operation of the charge pump 18 for the idle condition (i.e. UP=DOWN=0). When the UP input 36 is at logic level 0, transistor $Q_1$ is off and transistor $Q_2$ is on, which results in a current of magnitude 2I (where I is the desired output current pulse amplitude) flowing in the collector of the transistor $Q_2$. The current source $I_1$ provides half of the collector current 2I for transistor $Q_2$. Transistor $Q_{10}$ must provide the other half (i.e. I) of the collector current in transistor $Q_2$. As can be shown using Kirchoff's well-known voltage law, transistor $Q_{10}$ is turned on because the voltage level at the emitter of transistor $Q_{10}$ is at voltage $V_C$, where $V_C$ is the voltage at the output of the buffer stage 26, and therefore the voltage at the base of transistor $Q_{10}$ is always $V_C+V_{BE}$. This results in a bias voltage across diode $Q_5$ which is very close to zero, (i.e. $V_C+V_{BE9}-V_{BE10}=V_C$), hence the current flowing in diode $Q_5$ will be practically nil. Since the DOWN 40 input is at logic level zero in this state, transistor $Q_3$ is also off, and hence the current I produced by current source $I_3$ will flow in diode $Q_7$ (the cathode of commutating diode $Q_6$ cannot sink current). The operation of the clamping circuit 28 (i.e. current sink Is) causes a current of magnitude I to flow in diode $Q_7$ and an equal current I to flow in the collector of transistor $Q_8$. This equal splitting of the collector currents in diode $Q_7$ and transistor $Q_8$ produces base voltages which are equal to voltage $V_C$ and this results in an approximately zero voltage bias across the diodes $Q_5$ and $Q_6$ which keeps the diodes $Q_5$ and $Q_6$ in the non-conductive state. In the non-conduction state, the diodes $Q_5$ and $Q_6$ block any flow of the output current $I_O$ to the loop filter 32 which results in extremely low idle state leakage current which is independent of the output current $I_O$.

Figure 4:
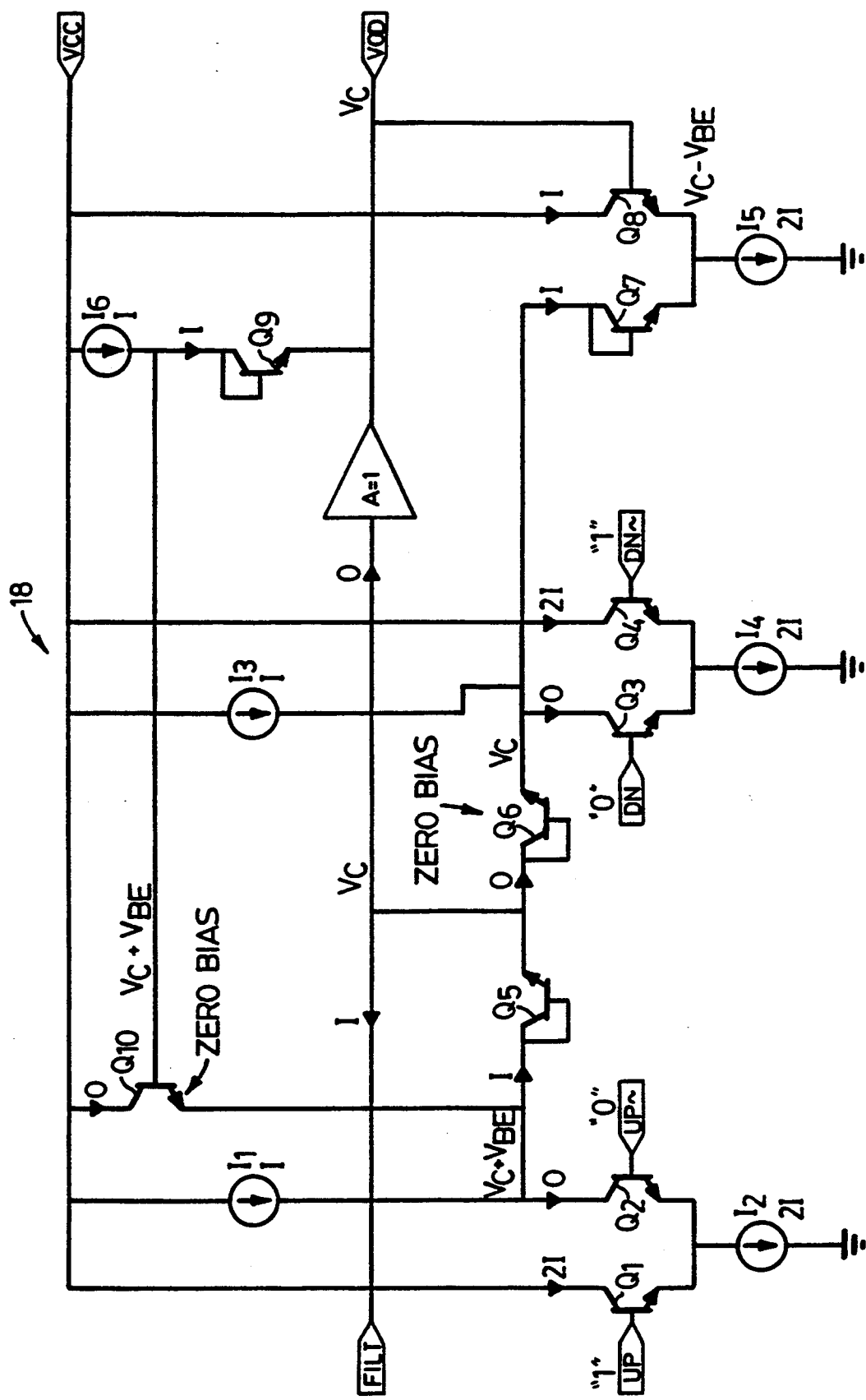
FIG. 4 shows the charge pump according to the present invention operating in the "PUMP UP" state.

Reference is next made to FIG. 4 which shows the operation of the charge pump 18 for the "PUMP UP" state, i.e. UP=logic level 1 and DOWN=logic level 0. Since the DOWN input 40 is at logic level 0, the zero bias condition of diode $Q_6$ is set up in the same fashion as for the idle condition discussed above. However if the UP input 36 is at logic level 1, transistor $Q_2$ is turned off, and therefore the current I from current source $I_1$ will flow into the diode $Q_5$ since the emitter of $Q_{10}$ opposes the direction of current flow from current source $I_1$. This causes the voltage level at the emitter of transistor $Q_{10}$ to be $V_C+V_{BE}$. Thus transistor $Q_{10}$ is zero biased (i.e. turned off) and therefore provides essentially no current to diode $Q_5$. Since diode $Q_6$ is turned off, the output current $I_O$ having a magnitude of I will flow through diode $Q_5$ to the loop filter output 32 and feed the loop filter 12. It will be appreciated by one skilled in the art that the voltage at the collector of the transistor $Q_2$ is required to slew through a voltage level of 1 $V_{BE}$ to turn on the diode $Q_5$ and allow it to conduct the output current $I_O$. In the PUMP UP state, diode $Q_6$ remains turned off because it is reversed biased by the voltage $V_C$.

Figure 5:
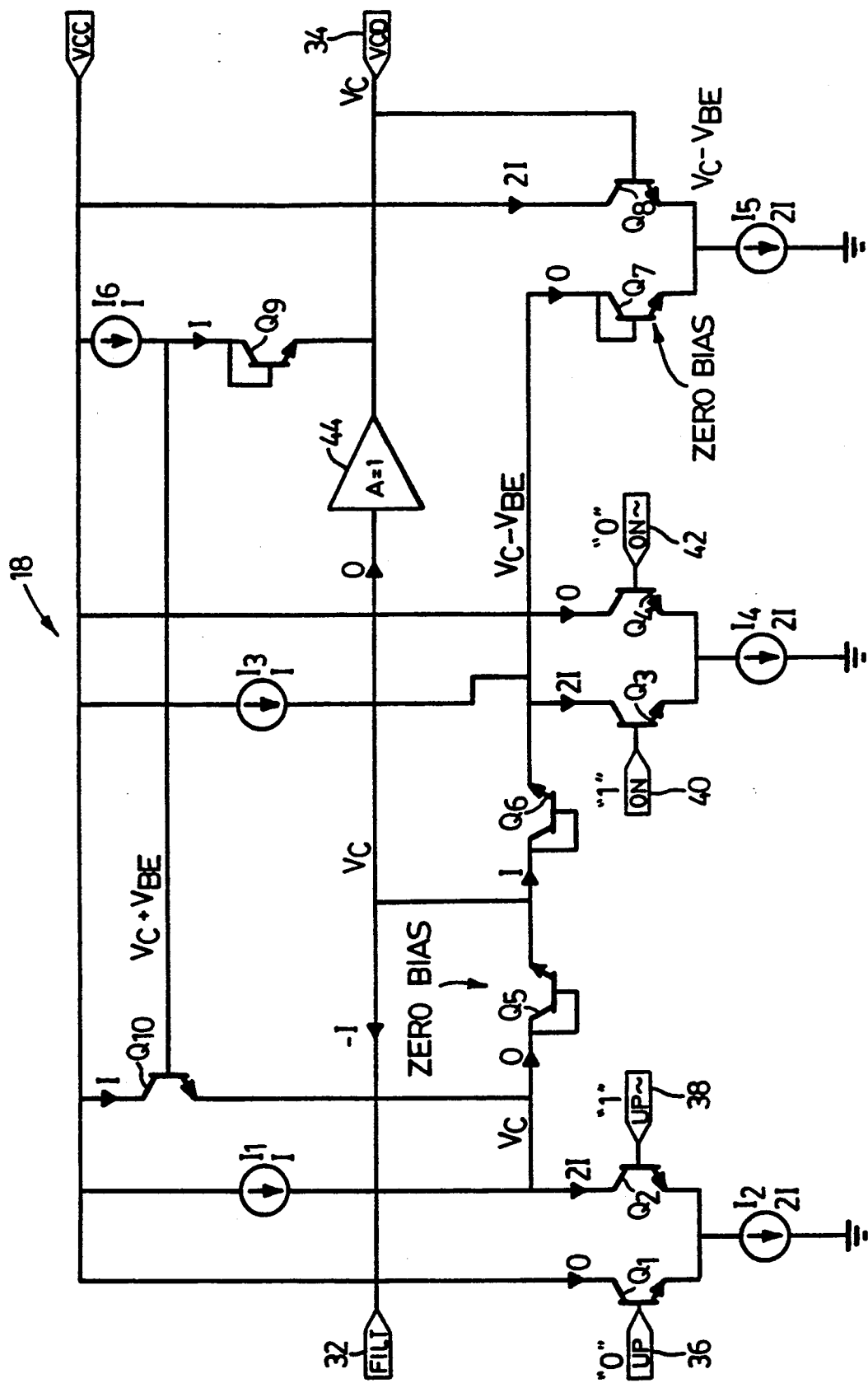
FIG. 5 shows the charge pump according to the present invention operating in the "PUMP DOWN" state.

Reference is now made to FIG. 5 which shows the operation of the charge pump 18 in the "PUMP DOWN" state. In the PUMP DOWN state, the UP input 36 is at logic level 0 and the DOWN input 40 is at logic level 1. Since the logic level on the UP* 36 input is one, transistor $Q_2$ is turned on and the current sink $I_2$ sinks a current 2I (i.e. current source $I_1$ supplies I and $Q_{10}$ supplies I). The zero forward bias condition for diode $Q_5$ is set up in the same fashion as for the idle condition discussed above. The logic level 0 at the DOWN* input 42 keeps transistor $Q_4$ turned off, hence the current sunk by current sink $I_4$ must flow through transistor $Q_3$. The current source $I_3$ supplies half of this quantity, i.e. I, and diode $Q_6$ sources the remainder, i.e. I to produce current 2I. This follows because diode $Q_7$ cannot source current at its anode.

Referring still to FIG. 5, when diode $Q_6$ turned on, the voltage at its emitter is $V_C-V_{BE}$ where $V_{BE}$ is the voltage drop across the base-emitter junction of the diode-connected transistor $Q_6$. This voltage produces an essentially zero bias condition for diode $Q_7$, and therefore diode $Q_7$ remains turned off and provides no conduction path for additional current flow. Since diode $Q_5$ is off and diode $Q_6$ is on, it follows that the output current $I_O$ will flow into diode $Q_6$ resulting in a negative output current $I_O$ being supplied to the loop filter 12. It will be appreciated that the voltage at the collector of transistor $Q_3$ is required to slew through a voltage of $V_{BE}$ to bring diode $Q_6$ into conduction (as was the case for transistor $Q_2$ in the "PUMP UP" state discussed above).

It will be appreciated by one skilled in the art that net current available to charge the nodes at the respective collectors of transistors $Q_2$ and $Q_3$ is current I. Therefore, to preserve symmetry of response for both UP and DOWN pulses, the parasitic loading at these nodes must also be essentially the same for both nodes. Referring to FIG. 5, the node at the collector of transistor $Q_2$ has a tally of 2 collectors ($Q_2$ and $Q_5$), 1 emitter ($Q_{10}$), and 1 current source ($I_1$) which produces a current with magnitude I. The tally for the node at the collector of transistor $Q_3$ is also 2 collectors ($Q_3$ and $Q_7$), 1 emitter ($Q_6$) and 1 current source ($I_3$).

Figure 6:
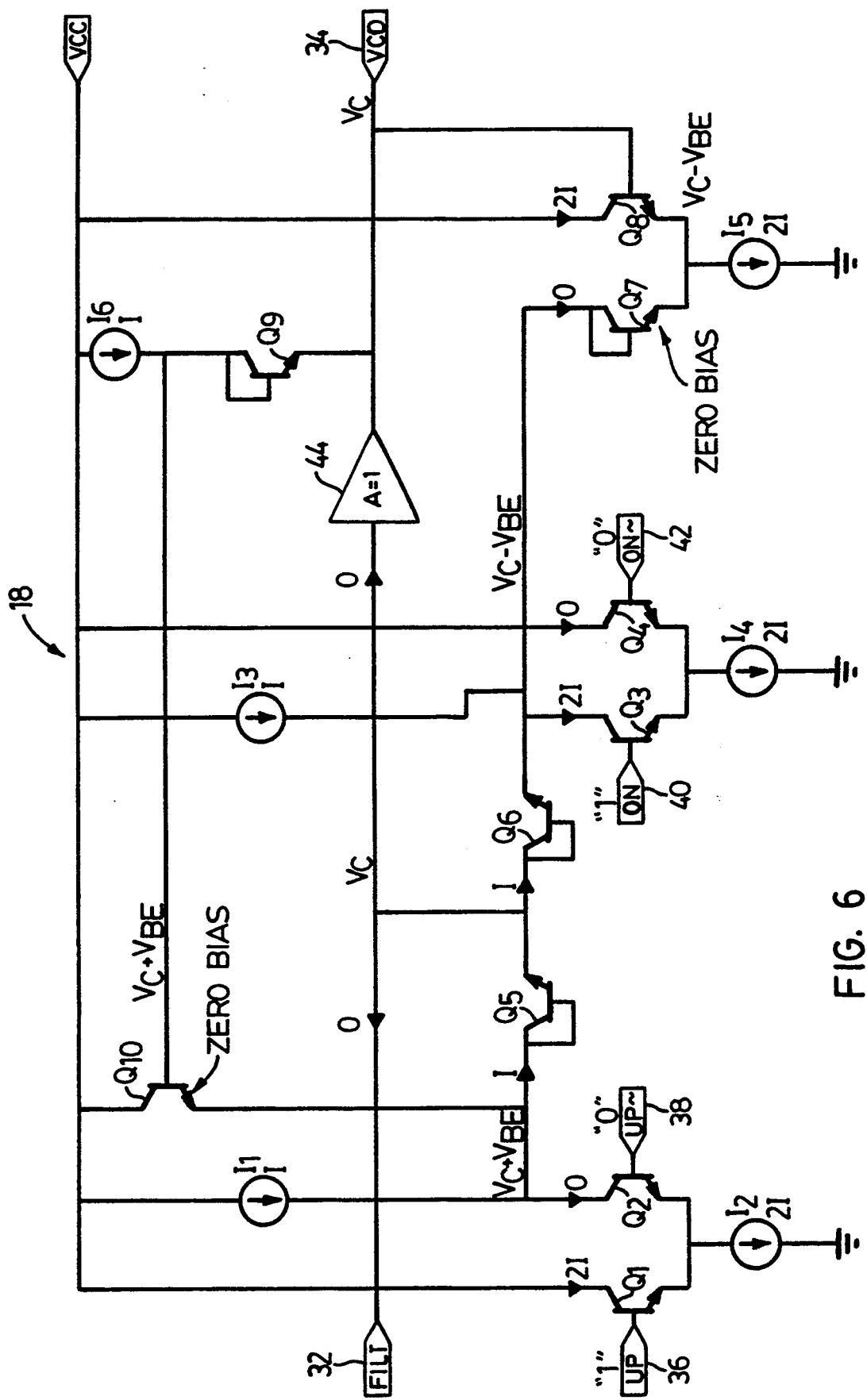
FIG. 6 shows the charge pump according to the present invention operating in an alternate idle state.

FIG. 6 shows the situation when the UP and DOWN pulses are both active high. This is referred to as "ALT IDLE" (alternate idle). Although both logic pulses are active high, the charge pump is expected to produce no output current $I_O$. This situation only occurs with certain implementations of phase/frequency detectors, and is much less critical for output leakage performance than the true idle condition (UP=DOWN=0) discussed above. In ALT IDLE state, the output current $I_O$ is the difference between the currents flowing in diode $Q_5$ and diode $Q_6$, and consequently the output current $I_O$ which leaks will not be as low as for the idle state discussed above. However for most applications, this resulting leakage current does not present a problem.

It will be evident to those skilled in the art that other embodiments of the charge pump topology fall within its spirit and scope as defined by the following claims.

I claim:

1. A device for producing an output current switchable between a source current and a sink current in response to binary logic pulses, said device comprising:
   (a) a first input stage for inputting a first binary logic pulse, said first input stage having an output and means for generating a first current component at said first output in response to said first binary logic pulse;
   (b) a second input stage for inputting a second binary logic pulse, said second input stage having an output and means for generating a second current component at the output of said second input stage in response to said second binary logic pulse;
   (c) current drive means for producing a third current component, said current drive means having an output for said third current component coupled to the output of said first input stage and including means responsive to a control signal for controlling said third current component; and
   (d) commutating means responsive to said first, second and third current components for producing the output current, said commutating means including first and second switches and an output port for the output current, said first switch having an input coupled to the output of said first input stage and an output and means for sourcing a constant output current at said output in response to said first and third current components, and said second switch having an output coupled to the output of said second input stage and having an input coupled to the output of said first switch and including means for sinking a constant output current at said input in response to said second current component, said output port being formed from the output of said first switch and the input of said second switch.

2. The device as claimed in claim 1, wherein said commutating means includes clamping means for limiting the voltage swing across said first and second switches, said clamping means being coupled to the output of said second input stage and to said current drive means and said clamping means including means responsive to said control signal.

3. The device as claimed in claim 2, wherein said first input stage comprises differential switching means having a first input port for receiving said first binary logic pulse, a second input port for receiving a complement of said first logic pulse, a control port, and an output port forming the output for said first input stage and being coupled to said first switch.

4. The device as claimed in claim 2, wherein said second input stage comprises differential switching means having a first input port for receiving said second logic pulse, a second input port for receiving a complement of said second logic pulse, a control port, and an output port forming the output for said second input stage and being coupled to said second switch.

5. The device is claimed in claim 2, wherein said clamping means includes current mirror means having first and second input ports, a control port, said first input port being coupled to the output of second input stage and to said second switch, and said second input port being coupled to said current drive means and to a voltage control input port.

6. The device as claimed in claim 5, wherein said current mirror means comprises first and second transistors, a current sink and a buffer, said first and second transistors each having a collector, a base and an emitter, the collector and the base of said first transistor being connected to said second switch and to the output of said second input stage, the emitters of said first and second transistors being connected to said current sink, and the base of said second transistor being connected to said buffer, so that said clamping means are referenced to at voltage level on said output port of the device thereby limiting the voltage swing across the first and second diodes.

7. The device as claimed in claim 3, wherein said first input stage includes a current source and said differential switching means comprises first and second transistors, and a current sink, said first and second transistors each having a collector output, a base input and an emitter output, and the emitter output of said first and second transistors being coupled to each other and to said current sink, the collector of said second transistor being coupled to said current source and providing the output for said first current component, and the base inputs of said first and second transistors providing said respective first and second input ports for receiving the said first binary logic pulses.

8. The device as claimed in claim 1, 2, 3, or 4, further including means for coupling to a loop filter stage, said loop filter stage being part of a phase-locked loop circuit, and said loop filter stage including means for converting said output current into a voltage signal.

9. The device as claimed in claim 8, wherein said means for converting comprises an integrating capacitor, said integrating capacitor being coupled to said output port and producing said voltage signal in response to said output current.

10. The device as claimed in claim 1, wherein said first and second switches each comprise a diode formed from a NPN transistor having a collector terminal and a base terminal connected together.

11. The device as claimed in claim 3 or 4, wherein said differential switching means each comprise a pair of NPN transistors, each transistor having an emitter terminal, a base terminal, and a collector terminal, said emitter of each transistor being connected together so that said transistors form an emitter-coupled transistor pair.

12. A charge pump circuit suitable for integration in a phase-detector stage in a phase-locked loop circuit, the phase-locked loop circuit also including a loop filter having an integrator which is coupled to said charge pump, said charge pump comprising:
   (a) a first input stage for inputting a first logic pulse, said first input stage having an output and means for generating a first current component at said output in response to said first logic pulse;
   (b) a second input stage for inputting a second logic pulse, said second input stage having an output and means for generating a second current component at the output of said second input stage in response to said second logic pulse;
   (c) current drive means for producing a third current component, said current drive means having an output for said third current component coupled to the output of said first input stage and including means responsive to a control signal for controlling said third current component;

(d) commutating means responsive to said first, second and third current components for producing the output current, said commutating means including first and second switches and an output port, said first switch having an input coupled to the output of said first input stage and an output and means for sourcing a constant output current at said output in response to said first and third current components, and said second switch having an output coupled to the output of said second input stage and having an input coupled to the output of said first switch and including means for Sinking a constant output current at said input in response to said second current component, and said output port being formed from the output of said first switch and the input of said second switch; and (e) said output port being coupled to the integrator in the loop filter stage and said integrator having means for converting the output current into a voltage signal.

* * * * *